United States Patent
Tran et al.

(10) Patent No.: US 7,315,069 B2
(45) Date of Patent: Jan. 1, 2008

(54) INTEGRATED MULTI-PURPOSE GETTER FOR RADIO-FREQUENCY (RF) CIRCUIT MODULES

(75) Inventors: Dean Tran, Westminster, CA (US); Jerry T. Fang, Palos Verdes Estates, CA (US); Yoshio Saito, Westchester, CA (US); Mark Kintis, Manhattan Beach, CA (US); Chih Chang, Torrance, CA (US); Phu H. Tran, Huntington Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 102 days.

(21) Appl. No.: 10/997,252

(22) Filed: Nov. 24, 2004

(65) Prior Publication Data

US 2006/0110299 A1    May 25, 2006

(51) Int. Cl.
*H01L 29/72* (2006.01)
(52) U.S. Cl. .................. 257/414; 257/728; 438/115; 422/186.29; 252/181.1; 502/400
(58) Field of Classification Search .......... 257/414, 257/728; 422/186.29; 252/181.1; 438/115; 502/400
See application file for complete search history.

(56) References Cited

U.S. PATENT DOCUMENTS

| 4,003,840 | A | 1/1977 | Ishino et al. |
| 4,023,174 | A | 5/1977 | Wright |
| 4,038,660 | A | 7/1977 | Connolly et al. |
| 4,948,922 | A | 8/1990 | Varadan et al. |
| 5,189,078 | A | 2/1993 | Johnson et al. |
| 5,888,925 | A * | 3/1999 | Smith et al. ............... 502/400 |
| 5,892,476 | A | 4/1999 | Gindrup et al. |
| 6,369,442 | B1 | 4/2002 | Saito |
| 6,423,575 | B1 | 7/2002 | Tran et al. |
| 2003/0062610 | A1 | 4/2003 | Kovacs et al. |
| 2004/0023058 | A1 | 2/2004 | Kovacs et al. |
| 2004/0036168 | A1* | 2/2004 | Bedinger et al. ........... 257/728 |

FOREIGN PATENT DOCUMENTS

| EP | 0 025 647 A2 | 3/1981 |
| WO | WO 2004/037447 A1 | 5/2004 |

\* cited by examiner

*Primary Examiner*—Edward Wojciechowicz
(74) *Attorney, Agent, or Firm*—Carmen B. Patti & Assoc., LLC

(57) ABSTRACT

An integrated getter structure and a method for its formation and installation in a circuit module enclosure (24). The integrated structure includes a hydrogen getter structure (10) and selected quantities of a material (20) that is formulated to provide both a particle getter function and an RF absorber function. In one embodiment, the material (20) is placed in discrete quantities over the hydrogen getter structure (10). In another embodiment, the hydrogen getter structure (10) is formed over a sheet of the material (20) and is provided with apertures (30) to expose the material (20).

16 Claims, 2 Drawing Sheets

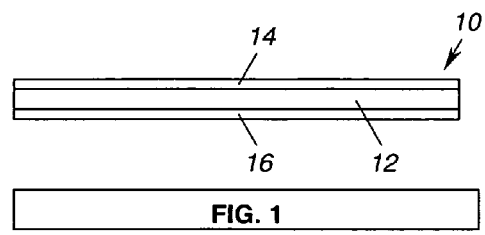
FIG. 1
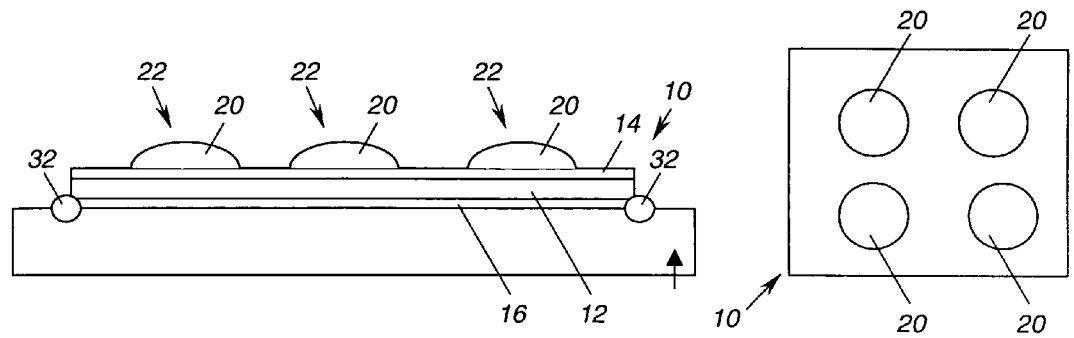
FIG. 2A  FIG. 2B
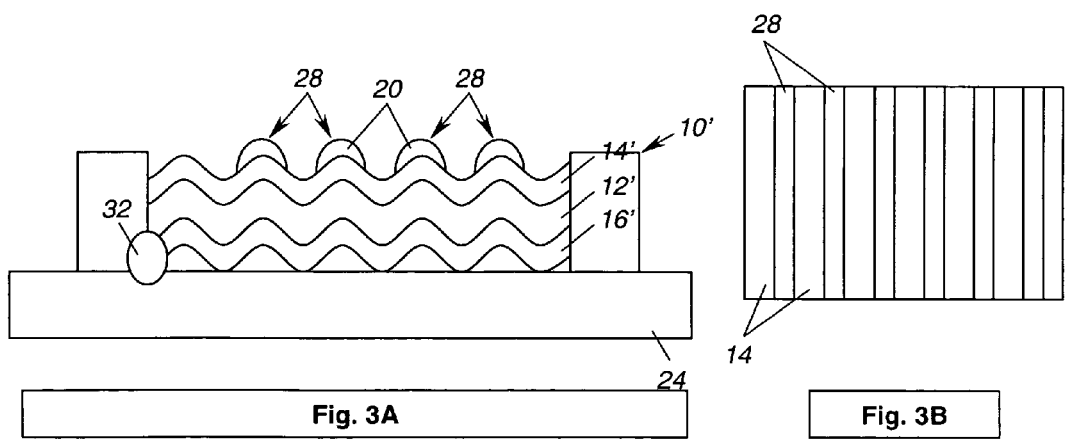
Fig. 3A  Fig. 3B

INTEGRATED MULTI-PURPOSE GETTER FOR RADIO-FREQUENCY (RF) CIRCUIT MODULES

BACKGROUND OF THE INVENTION

This invention relates generally to radio-frequency (RF) circuit modules and, more particularly, to structures for reducing the effects of unwanted materials or radiation within circuit modules or packages. In a chemical or metallurgical process, a "getter" is a material added in small amounts during the process to absorb impurities. In this specification, the term "getter" is used to encompass any material or structure for reducing the effects of unwanted materials or radiation, whether by absorption, scattering, dispersion, or some other process.

In the electronics packaging industry, hydrogen is known to affect electrical performance adversely, but hydrogen is an unavoidable component in the electronics package module, such as in plated nickel layer. With the passage of time, especially in a space environment or in the low pressure environment, hydrogen can diffuse out from the materials in which it was originally contained, and cause permanent damage or adversely affect the electrical performance of the electronics module. Hydrogen getters have been developed to alleviate this problem, as described in U.S. Pat. No. 6,423,575 to Dean Tran et al., and U.S. Pat. No. 6,369,442 to Yoshio Saito. For completeness, the disclosures or these patents are incorporated by reference into this specification. A hydrogen getter structure typically includes a layer of a material known to absorb hydrogen by chemical reaction, such as titanium, and an overlying layer of a material such as palladium, which facilitates entry of hydrogen into the titanium layer but prevents oxidation of the titanium. There may also be a layer of a contact metal, such as silver or gold, underlying the titanium. One of more hydrogen getters of this type are formed of appropriate size and shape and then incorporated into the RF module, such as by affixing them to a module enclosure surface.

Other potential unwanted contaminants in RF circuit modules take the form of particles. Loose particles can arise from a number of sources during the fabrication and assembly processes and may remain in the sealed package. The need to deal with particle contamination in sealed electronics, superconducting or photonics modules has given rise to the development of particle getter structures that must also be incorporated into the module package before sealing. These may take the form of silicone materials that act in part as adhesives, to catch any loose particles that would otherwise be free to move about the sealed package. Particle getter structures in the past have been separately formed and installed in the enclosure or elsewhere in the package.

The need for absorption of radio frequency (RF) radiation in an electronics module is also well known. Especially at very high frequencies, unwanted resonances can occur within module cavities, effectively precluding or adversely affecting operation at certain frequencies. RF absorbing structures are known in the art, and have in the past also been separately formed and installed in the module package. For example, a commercially available material, ECCOSORB® RF, manufactured by Emerson & Cuming Microwave Produces, Randolph, Mass., is an RF absorber that can be machined to appropriate shapes for inclusion in an RF package housing.

Prior to the present invention, hydrogen getter structures, particle getter structures and RF absorbing structures were individually formed and installed in an electronics module package for RF application. The costs of manufacturing and assembly of the three types of getter/absorber are, therefore, a significant proportion of the total product cost of each circuit module. Moreover, each type of getter adds to the total weight of the module. For some applications, such as in spacecraft, module weight is critically important because it impacts the cost of launching the spacecraft.

Accordingly, it will be appreciated that there is still a significant need for a structure and related method that would perform the functions of a hydrogen getter, a particle getter and an RF absorber, but without imposing a requirement to form and install each type of getter/absorber separately. This would result in an RF circuit module that was less costly, more compact and lighter in weight. The present invention satisfies this need.

SUMMARY OF THE INVENTION

The present invention resides in a getter structure that combines at least two of the three principal getter functions in an electronic module. The structure of the invention may be defined as an integrated multi-purpose getter structure suitable for installation in an electronics module, especially an RF package. Briefly, and in general terms, the getter structure comprises a quantity of material providing a particle getter function and an RF absorber function. This quantity of material is formable into portions of appropriate size and shape for installation in the RF circuit module.

More specifically, the integrated multi-purpose getter structure further comprises a hydrogen getter structure integrated with the portions of the quantity of material. The multi-purpose getter structure thereby performs the combined functions of particle getter, hydrogen getter and RF absorber.

As disclosed by way of example in one embodiment of the invention, the hydrogen getter structure is formed over an enclosure surface of the RF circuit module; and the portions of the quantity of material are formed over the hydrogen getter structure. In an alternative embodiment of the invention, the quantity of material is formed as a generally continuous layer over an enclosure surface of the RF circuit module; and the hydrogen getter structure is formed over the continuous layer and includes a plurality of apertures through which the quantity of material is exposed to provide the particle getter and RF absorber functions.

More specifically, the material combining the functions of particle getter and RF absorber comprises a silicone suspension to provide the particle getter function, mixed with a powdered metal-containing material to provide the RF absorber function. The powdered metal-containing material may be any suitable selection or combination of transition elements, such as the iron, cobalt and rhodium in combination, scandium, tantalum, vanadium, or a metal-organo compound in which a metal atom is linked into a carbon chain or carbon branch structure or polymer that has polar helix structure. Preferably, the powdered metal is iron. In a specific embodiment of the invention, powdered iron approximately in the size range 6-10 microns is mixed with a silicone suspension such that approximately 60-70 percent, by weight, of the resulting material is iron.

The hydrogen getter structure in the integrated getter typically comprises a hydrogen-absorbing metal layer and a facilitating over-layer allowing one-way pass-through of hydrogen to the absorbing underneath layer and protecting the absorbing metal from oxidation. Specifically, the hydrogen-absorbing layer may be titanium and the protective over-layer may be palladium or rhodium. The hydrogen getter structure may further comprise a metal contact layer on which the titanium metal layer is formed.

The present invention may also be defined in terms of a method of forming an integrated multi-purpose getter structure in a radio-frequency (RF) circuit module. In brief, the method comprises the steps of taking a silicone dispersion material; mixing a metal-containing powdered material in the silicone dispersion material; placing the mixed silicone dispersion material in an RF circuit module enclosure; and curing the mixed silicone dispersion material to provide a combined particle getter function and RF absorber function. To provide the additional hydrogen getter function, the method further comprises the step of integrating the mixed silicone dispersion material with a hydrogen getter structure in the RF circuit module enclosure, to provide combined hydrogen getter, particle getter and RF absorber functions in the same structure.

It will be appreciated from the foregoing summary, that the invention provides a significant advance in the field of manufacture and packaging of RF circuit modules. In particular, the invention combines the functions of at least two of a hydrogen getter, a particle getter and an RF absorber. Other aspects and advantages of the invention will become apparent from the following more detailed description, taken in conjunction with the accompanying drawings.

BRIEF DESCRIPTION OF THE DRAWINGS

FIG. 1 is cross-sectional view of a hydrogen getter of the prior art.

FIGS. 2A and 2B are cross-sectional and plan views, respectively, of an integrated getter structure in accordance with the present invention.

FIGS. 3A and 3B are views similar to FIGS. 2A and 2B, respectively, but depicting an alternate embodiment of the invention.

DETAILED DESCRIPTION OF THE INVENTION

Figure 4A:
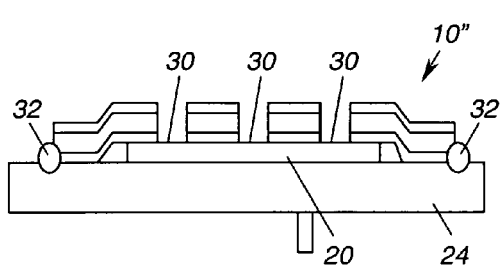
FIGS. 4A and 4B are views similar to FIGS. 2A and 2B, respectively, but depicting another alternate embodiment of the invention.

As shown in the drawings for purposes of illustration, the present invention pertains to a novel approach to performing the functions of a hydrogen getter, a particle getter and an RF absorber, in a radio frequency (RF) circuit module. As noted above, an RF circuit package sealed in an enclosure is subject to contamination by hydrogen and by loose particles trapped within the enclosure, and is also subject to the effects of RF signals propagating within the package and producing cavity resonance effects and unwanted RF losses. In the past, each of these three types of contamination has been dealt with by installing special structures in the RF package, namely a hydrogen getter structure, a particle getter structure and an RF absorber structure.

In accordance with the present invention, at least two of these three structures are combined into one integrated structure, thereby simplifying manufacture and assembly, reducing cost and reducing module weight. FIG. 1 shows, by way of example, a hydrogen getter structure 10 of the prior art. The structure includes a layer 12 of a metal, such as titanium, that absorbs hydrogen by chemical reaction, and an overlying layer 14 of a protective material, such as palladium, which allows entry of hydrogen but protects the titanium layer 12 from oxidation. The titanium layer 12 may also have an underlying layer 16 of a contact metal, such as silver or gold, which performs no part in the hydrogen getter function, but may be used to facilitate attachment of the structure 10 inside an RF module enclosure.

An important aspect of the invention is that the functions of particle getter and RF absorber are combined in a single material. More specifically, the material, shown at 20 in FIGS. 2A, 2B, 3A, 3B, 4 and 5, is formed by starting with a base silicone material that functions as a particle getter, and mixing a powdered metal-containing material into the silicone, using, for example, a roller mixer to ensure a uniform dispersion within the material. Good results were obtained using a silicone dispersion as the base material, specifically a silicone dispersion designated MED 1356, manufactured by NuSil Technology, Carpinteria, Calif. The powdered metal-containing material may be any suitable transition metal that functions as an RF absorber, such as iron, cobalt and rhodium in combination, scandium, tantalum, vanadium, or any of a number of metal-organo compounds in which a metal atom is linked into a carbon chain structure or polar helix polymer. Good results were obtained using an iron powder with a 6-10 micron particle size and 99.5% purity. The iron particles were mixed with the silicone material such that the iron was 60-70% by weight of the resulting mixture, which may then be placed in a suitable mold or otherwise positioned in the module enclosure or its lid. Then the mixture is allowed to cure at ambient temperature.

As shown in FIGS. 2A and 2B, in one embodiment of the invention the iron-impregnated silicone material 20 is formed as a plurality of generally round "buttons" on the palladium upper surface 14 of the hydrogen getter 10. For purposes of illustration, the hydrogen getter 10 is shown as being installed on an enclosure lid 24.

In the embodiment of FIGS. 3A and 3B, the hydrogen getter, indicated by 10', is formed in a sinuous wave configuration. That is to say, the layers of titanium 12', palladium 14' and contact metal 16' are not planar but have a sinuous shape as viewed in cross section. As viewed from above, as in FIG. 3B, the palladium layer is corrugated into parallel ridges and troughs. The iron-impregnated silicone material 20 is formed as longitudinal stripes 28 along the crests of the corrugations in the underlying hydrogen getter structure 10'.

Figure 4B:
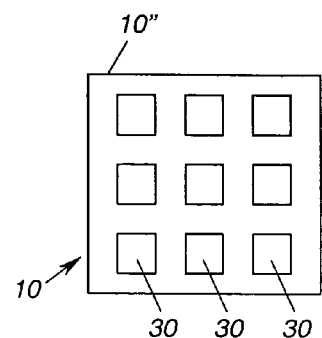
Figure 5:
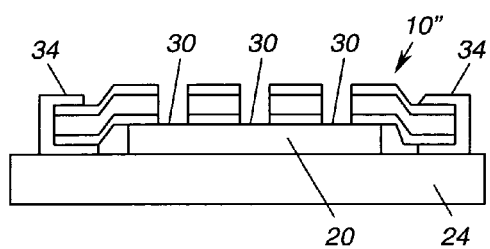
FIG. 5 is a cross-sectional view similar to FIG. 4A, but depicting an alternate assembly scheme.

The embodiment of FIGS. 4A and 4B is one in which composite particle getter and RF absorber material 20 is first formed on the lid 24, and then a hydrogen getter structure 10" is formed over the material 20, but with apertures through the structure 10" to expose regions 30 of the material 20.

Figure 6:
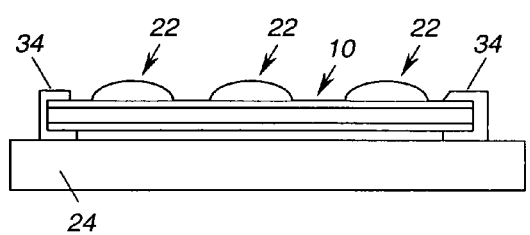
FIG. 6 is a cross-sectional view similar to FIG. 2A, but depicting the alternate assembly scheme used in FIG. 5.

In the embodiments of FIGS. 2A-2B, 3A-3B and 4A-4B, the hydrogen getter structure 10, 10' and 10", respectively, is secured to the lid 24 by a circumferential bead of solder 32. In an alternate assemble scheme, shown in FIGS. 5 and 6, a dipped solder wrap 34 extends around the peripheral edges of the hydrogen getter structure 10" or 10.

In experiments testing various thicknesses of the iron-impregnated silicone material 20, RF absorbing performance was found to be as good as or better than that of a conventional layer of ECCOSORB® material, which, of course, has no particle absorbing properties. More specifically, the material 20 was formed to various thicknesses in an RF module package lid. The thicknesses used in the test were 185 mil (4.7 mm), 205 mil (5.3 mm), 225 mil (5.7 mm).

Measurements were also taken using a layer of ECCOSORB® material of thickness 225 mil (5.7 mm), and for comparison the same RF measurements were taken without any RF absorber present. Without an RF absorber of any kind, the test package showed large resonances at two frequencies of interest. Use of the iron-impregnated silicone material 20 reduced these resonant effects just as well as the ECCOSORB® material. In a further test, the iron impregnated material 20 was coated with an additional coating of the same silicone material (without iron). The coating did not significantly affect the RF absorbing performance of the structure. Therefore, an option is to coat the iron-impregnated material 20 with additional silicone, which will not affect RF performance but may increase particle getting performance.

In summary, the invention provides a material that functions both as an RF absorber and a particle getter. This material may be combined in various ways with a conventional hydrogen getter structure, to provide an integrated hydrogen getter, particle getter and RF absorber. The resulting RF circuit module may be enclosed in a more compact package because the integrated getter/absorber uses the enclosure volume more efficiently. Also, manufacturing costs are reduced significantly and the module weight is also reduced by use of the invention.

It will be appreciated from the foregoing that the present invention represents a significant advance in the field of RF circuit modules or packages. In particular, the invention provides an RF module at lower cost and lower weight and volume, by combining the functions of hydrogen getter, particle getter and RF absorber into a single structure. It will also be appreciated that, although specific embodiments of the invention have been illustrated and described by way of example, various modifications may be made without departing from the spirit and scope of the invention. Accordingly, the invention should not be limited except as by the appended claims.

The invention claimed is:

1. An integrated multi-purpose getter material adapted for use in a radio-frequency (RF) circuit module having an interior surface, the getter material comprising:
   a first layer of hydrogen adsorbing material disposed on the interior surface;
   a second layer of material covering the first layer where the second layer protects the first layer from oxidation;
   a quantity of further material providing both a particle getter function and an RF absorber function, where the quantity of further material is disposed at a plurality of spaced-apart locations on the second layer so that a first portion of the area of the second layer is covered by the quantity of the further material and a second portion of the area of the second layer is not covered by the quantity of the further material;
   wherein the quantity of the further material and first and second layers fit inside the enclosure of the RF circuit module.

2. An integrated multi-purpose getter material as defined in claim 1, and further comprising a hydrogen getter structure comprising the first and second layers.

3. An integrated multi-purpose getter material as defined in claim 2, wherein the spaced-apart locations of the quantity of the further material comprise a plurality of spaced-apart buttons of the quantity of the further material.

4. An integrated multi-purpose getter material as defined in claim 2, wherein the spaced-apart locations of the quantity of the further material comprises a plurality of spaced-apart rows of the quantity of the further material.

5. An integrated multi-purpose getter material as defined in claim 1, wherein the further material comprises a silicone suspension base to provide the particle getter function mixed with a powdered metal-containing material to provide the RF absorber function.

6. An integrated multi-purpose getter material as defined in claim 5, wherein the powdered metal-containing material is a one of the materials selected from the transition group consisting of iron, cobalt and rhodium in combination, scandium, tantalum, vanadium, and a metal-organo compound in which a metal atom is linked into a carbon chain structure.

7. An integrated multi-purpose getter material as defined in claim 5, wherein the powdered metal-containing material is a polar helix polymer.

8. An integrated multi-purpose getter material as defined in claim 6, wherein the powdered metal-containing material is iron.

9. An integrated multi-purpose getter material as defined in claim 8, wherein the powdered iron has a size approximately in the range 6-10 microns, having been mixed with the silicone suspension such that approximately 60-70 percent, by weight, of the material is iron.

10. An integrated multi-purpose getter material as defined in claim 2, wherein the further material comprises a silicone suspension base to provide the particle getter function mixed with a powdered metal-containing material to provide the RF absorber function.

11. An integrated multi-purpose getter material as defined in claim 10, wherein the powdered metal-containing material is a one of the materials selected from the group consisting of iron, cobalt and rhodium in combination, scandium, tantalum, vanadium, and a metal-organo compound in which a metal atom is linked into a carbon chain structure.

12. An integrated multi-purpose getter material as defined in claim 11, wherein the powdered metal-containing material is iron.

13. An integrated multi-purpose getter material as defined in claim 12, wherein the powdered iron has a size approximately in the range 6-10 microns, having been mixed with the silicone suspension such that approximately 60-70 percent, by weight, of the material is iron.

14. An integrated multi-purpose getter material as defined in claim 2, wherein the first layer is a hydrogen-absorbing metal layer and the second layer is a protective over-layer allowing one-way passage of hydrogen to the metal layer and protecting the metal layer from oxidation.

15. An integrated multi-purpose getter material as defined in claim 14, wherein the hydrogen-absorbing layer comprises titanium; and the protective over-layer comprises palladium.

16. An integrated multi-purpose getter material as defined in claim 15 and further comprising a metal contact layer on which the titanium metal layer is formed.

* * * * *